United States Patent [19]

Hartleroad et al.

[11] 3,911,569

[45] Oct. 14, 1975

[54] METHOD AND APPARATUS FOR BONDING MINIATURE SEMICONDUCTOR PILL-TYPE COMPONENTS TO A CIRCUIT BOARD

[75] Inventors: Ronald J. Hartleroad, Twelve Mile; James P. Grabowski, Carmel, both of Ind.

[73] Assignee: General Motors Corporation, Detroit, Mich.

[22] Filed: Nov. 18, 1974

[21] Appl. No.: 525,022

[52] U.S. Cl. .................... 29/626; 29/588; 29/471.3; 228/4

[51] Int. Cl.$^2$ ............................................ H05K 3/34

[58] Field of Search .......... 29/576 S, 588, 626, 628, 29/627, 471.1, 471.3; 228/4–6

[56] References Cited

UNITED STATES PATENTS

| | | | |
|---|---|---|---|
| 3,517,438 | 6/1970 | Johnson et al. | 29/627 |
| 3,544,857 | 12/1970 | Byrne et al. | 29/627 X |
| 3,655,177 | 4/1972 | Coucoulas | 228/4 X |
| 3,700,155 | 10/1972 | Hermanns | 228/3 |

*Primary Examiner*—Al Lawrence Smith
*Assistant Examiner*—K. J. Ramsey
*Attorney, Agent, or Firm*—Robert J. Wallace

[57] ABSTRACT

A method and apparatus for transferring miniature semiconductor device pill-type components from a temporary carrier lead frame and directly bonding them to a printed circuit board. Each pill-type component has a semiconductor device chip encapsulated in a plastic body and a radial array of leads extending from the body. The circuit board has an opening in it to receive the pill body, and a plurality of conductors converging on the opening in a pattern corresponding to the pill leads. A pill on the lead frame is registered closely over a circuit board opening and its converging conductors. A combination transfer and soldering tool is registered over the pill. The bottom end of the tool is metal and has a periphery corresponding to and slightly smaller than the periphery of the pill leads. A heat insulating insert in the tool bottom end corresponds to the pill body. The tool is lowered, with the insert engaging the pill body, to separate the pill from the lead frame and press the pill body into the circuit board opening. The tool is heated to concurrently solder the pill leads to the circuit board conductors.

4 Claims, 9 Drawing Figures

METHOD AND APPARATUS FOR BONDING MINIATURE SEMICONDUCTOR PILL-TYPE COMPONENTS TO A CIRCUIT BOARD

BACKGROUND OF THE INVENTION:

This invention relates to a method and apparatus for bonding miniature semiconductor components to a printed circuit board. More particularly, it involves a method and apparatus for bonding semiconductor pill-type components to a printed circuit board directly from a lead frame serving as a temporary carrier.

The semiconductor pill-type component is a plastic encapsulated semiconductor device package. In the package, a semiconductor device chip is encapsulated in a plastic body and an array of leads radially extend outwardly in a common plane from the edge of the plastic body. The semiconductor device chip may be a discrete transistor or diode, but generally would be an integrated circuit chip. Inner portions of the leads within the plastic body are connected to various contact areas on the chip. The portions of the leads outside the body provide means for electrical interconnection between the chip and external circuitry.

A principal advantage of the "pill" package design is that it is a low cost subassembly that can be readily tested before mounting in another product. Briefly, the pills are made by bonding semiconductor device chips to leads on a lead frame that serves as a temporary carrier. Each group of leads on the frame includes at least two pill holding tabs that are not electrically functional. The chips are each separately encapsulated with plastic to form a tablet shaped body, a pill, with outer portions of the chip leads left exposed. All leads except the supporting holding tabs are then severed from the lead frame. Each chip is then tested while it is still attached to the lead frame by the pill holding tabs. Those pills meeting acceptable test requirements are removed from the lead frame and subsequently mounted onto a larger lead structure for re-encapsulation as a dual-in-line package (DIP). The miniature size and shape of the pill readily facilitates bonding it inside the DIP which in turn can be mounted on a printed circuit board or the like. The pill leads are readily welded to a DIP lead frame.

It would be highly advantageous to transfer the pill from its own temporary carrier lead frame and directly bond it to a printed circuit board. Accordingly, the time and expense of bonding the pill with the DIP could be eliminated. We have found a way to do this that is applicable to high volume commercial operations.

OBJECTS AND SUMMARY OF THE INVENTION

Therefore, it is an object of this invention to provide an efficient, high volume production method and apparatus for bonding miniature semiconductor pill-type components directly to a printed circuit board.

It is a further object of this invention to provide a method and apparatus for transferring a pill-type component from a temporary carrier lead frame and bonding it directly to a printed circuit board.

Briefly, a lead frame having a plurality of semiconductor pill-type components temporarily attached to it is supported closely above a printed circuit board. Each pill-type component includes a plastic body encapsulating a semiconductor device chip and a planar array of leads for the chip radially extending from the body. The printed circuit board has an opening corresponding in size and shape to the pill body and a plurality of conductors converging on the opening. A heated transfer and soldering tool is positioned over one of the pills. The tool includes a metal end surface which is slightly smaller than the outer periphery of the pill leads. The tool end surface has a heat insulating insert, preferably asbestos, which corresponds to the upper surface geometry of the pill body. The tool also includes at least two slots in its end surface which correspond to pill holding tabs in the lead frame. Alignment is accomplished by looking around the periphery of the end surface of the tool to see the outer portions of the pill leads extending outwardly from the tool. Once the pill leads and circuit board conductors are aligned, the tool end surface presses against the pill, with the tool insert engaging the pill body, to push the pill body into the opening in the circuit board. The pill leads are then pressed against their corresponding circuit board conductors by the metal peripheral portions of the end surface of the tool. The pill holding tabs are concurrently pulled out of the pill body by coaction with the slots in the tool. While pressing against the pill leads, the heated tool solders all of the pill leads simultaneously to their respective circuit board conductors. The heat insulative insert in the tool surface protects the plastic body from undue heating.

DESCRIPTION OF THE PREFERRED EMBODIMENT

Figure 1:
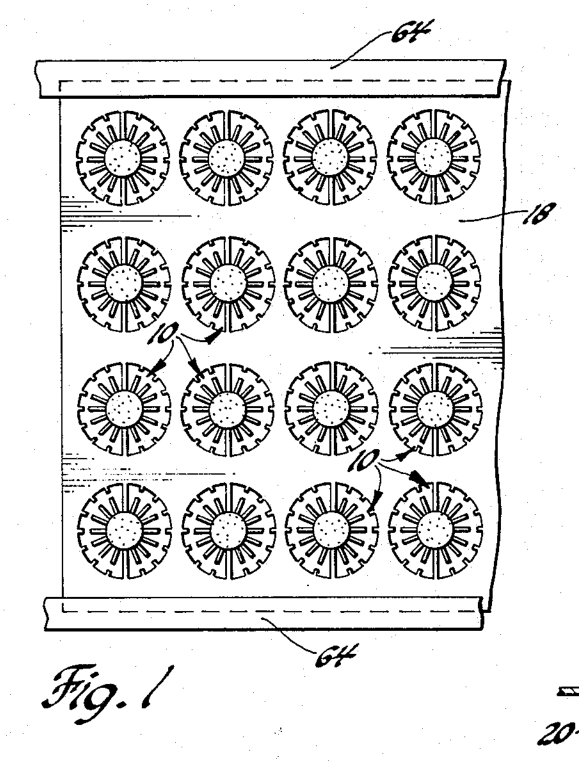
FIG. 1 is a plan view showing a temporary carrier lead frame having a plurality of semiconductor pill components attached thereto.

Referring now to the drawings, a semiconductor pill-type component, hereinafter referred to as a pill, is designated by reference numeral 10. In this example, each pill 10 includes a semiconductor chip 12 which is an integrated circuit die approximately 38 mils square. Preferably, the chip 12 is in integrally leaded device. For example, chip 12 is a semiconductor flip chip having a plurality of integral leads or contct bumps 14 on a major face thereof. Contact bumps 14 are extensions of a conductor pattern on the face of chip 12 and provide electrical interconnection points which facilitate bonding to larger conductive leads 16. A plurality of radially extending electrically conductive leads 16 have inner free end portions which are bonded to the contact bumps 14 on chip 12. The leads 16 were once an integral part of lead frame 18.

Before pills 10 were formed on lead frame 18, each group of pill leads 16 were the free ends of a plurality of spaced apart sets of mutually convergent cantilevered leads on the lead frame. The lead frame can be made of Alloy 42, which is an alloy containing, by weight, about 41.5% nickel, 0.05% carbon, 0.05% manganese, 0.25% silicon, and the balance iron. The lead frame 18 in this example is about 2½ mils thick. Lead frame 18 also includes two diametrically opposite holding tabs 20. Holding tabs 20 are integral extensions of lead frame 18, similar to pill leads 16 before the pills were formed. However, as can be seen more clearly in FIG. 2, holding tabs 20 are shorter than leads 16 originally were, and are not bonded to any of the contact bumps 14 on chip 12.

A plastic encapsulation or body 22 surrounds the chip 12, inner portions of leads 16, and the inner portions of holding tabs 20. In this example, holding tabs 20 are embedded about 0.03 inch into body 22. Body 22 provides a protective housing for chip 12. The plastic encapsulation serving as body 22 can be a thermosetting resin such as Polyset No. 410-B. Body 22 is a disc-shaped right cylinder and has a diameter of about 0.14 inch and is about 1/16 inch thick. As can be seen most clearly in FIGS. 1 through 3, the holding tabs 20 provide a temporary support or connection between the pill 10 and the lead frame 18. It should be noted that there can be several hundred pills supported on lead frame 18. The term pill-type component or pill as used herein includes both the pill body 22 and the leads 16 radially extending from it. It should be noted that the shape of the pill body may be other than a right cylinder, if desired. Analogously, the leads may also be in an asymmetrical radial array.

Referring now especially to FIGS. 4 – 7 and 9, there is shown a combination transfer and bonding device generally designated as 24. The device 24 includes a rod-like vertically extending tool 26 having an enlarged lower portion about 0.002 inch thick with a flat end surface 28. Tool surface 28 is generally circular with a diameter of about 0.19 inch. The diameter of tool surface 28 is slightly smaller than the circular diameter defined by the outer free ends of pill leads 16, which is approximately 0.26 inch. The diameter of tool surface 28 must be no larger than the diameter defined by the outer periphery of pill leads 16 and larger than the circuit board hold into which the pill is pressed. Preferably, for optimum results tool surface 28 should be no more than about ¾ the diameter defined by the outer periphery of pill leads, and at least 0.01 inch greater than the circuit board hole. In some instances the periphery of the pill leads may not define a circle. In such cases the geometry of the end surface of the tool should conform to the periphery of the surface pattern defined by the leads. However, the tool end surface should analogously be slightly smaller than the surface defined by the leads so that the outer portions of the leads will extend outwardly from the tool end surface when the tool is coaxially abutting the pill body.

Figures 5, 6, 7, 8, 9:
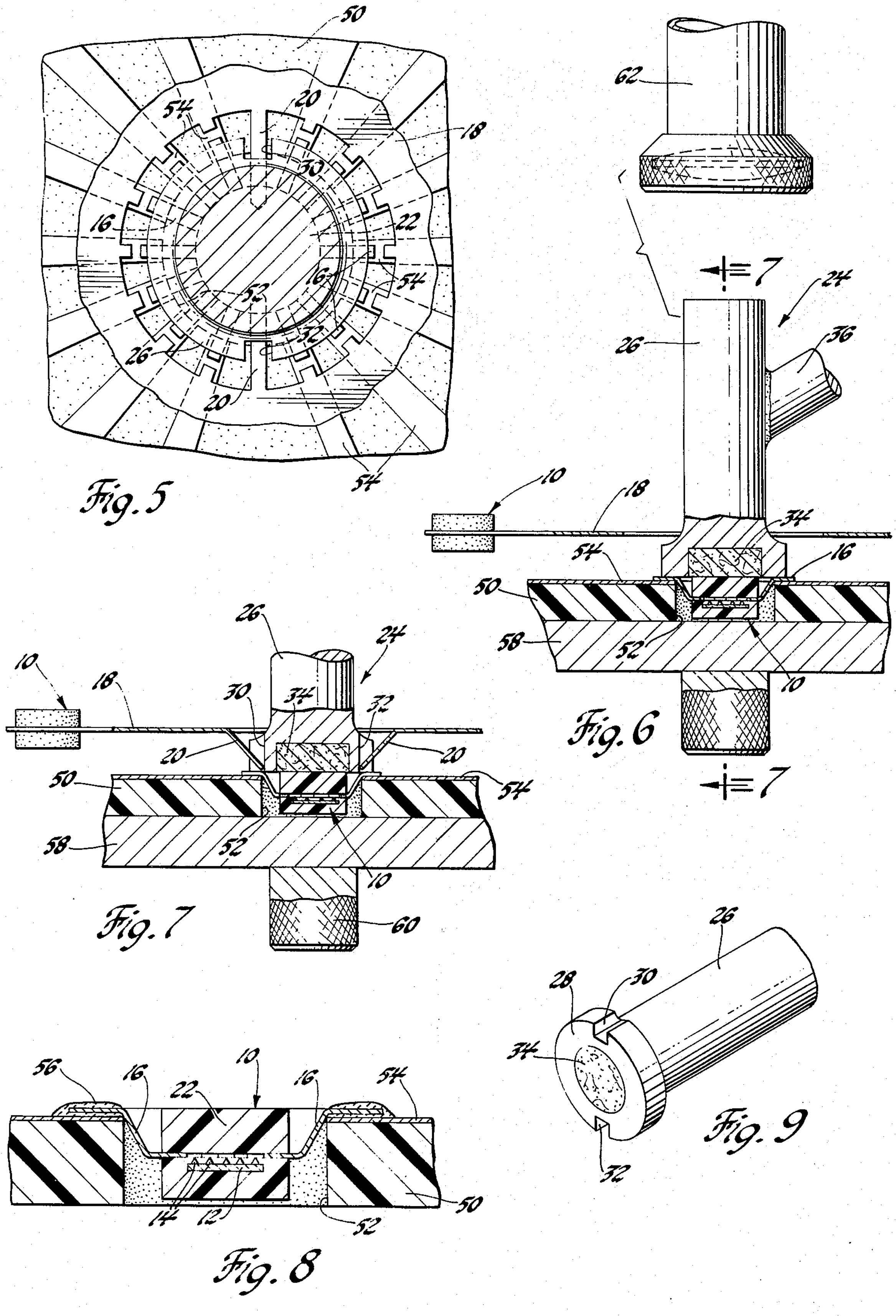
FIG. 5 is an enlarged fragmentary view along the lines 5—5 of FIG. 4.
FIG. 6 is a sectional view with parts in elevation of the apparatus shown in FIG. 4 during a succeeding step of the method of this invention.
FIG. 7 is a fragmentary sectional view, with parts in elevation, along the lines 7—7 of FIG. 6.
FIG. 8 is an enlarged sectional view of a semiconductor pill component bonded to a printed circuit board.
FIG. 9 is a fragmentary perspective view of the combination transfer and soldering tool as shown in FIGS. 4 through 7.

Two diametrically opposed axially extendings slots 30 and 32 in the edge of the enlarged lower portion of tool 26 intersect tool surface 28, as can be most clearly seen in FIGS. 7 and 9. Slots 30 and 32 are approximately 0.025 inch deep and are about 0.025 inch wide. The portion of slots 30 and 32 on tool 26 corresponds with holding tabs 20 in lead frame 18. A hat insulative insert 34, such as of asbestos of Vespar, in tool surface 28 is circular with a diameter about the same as that of pill body 22. In this example, insert 34 is about 0.145 inch in diameter and about 0.05 inch thick. It has a flat outer face which is coplanar with surface 28 of tool 26. It should be noted that the shape of insert 34 can be adapted to conform to the top of the pill body if it is not completely flat as in this example. For example, if the top of the pill body includes a small protrusion, the insert can include a corresponding indentation. Moreover, if desired, the lower portion of tool 26 can be removable, for replacement or interchange, analogous to commercially available soldering iron tips. For example, the lower portion can be threaded into the upper portion of the tool. However, for ease of illustration and clarity in describing this invention, we have shown tool 26 to have integral upper and lower portions.

Figure 4:
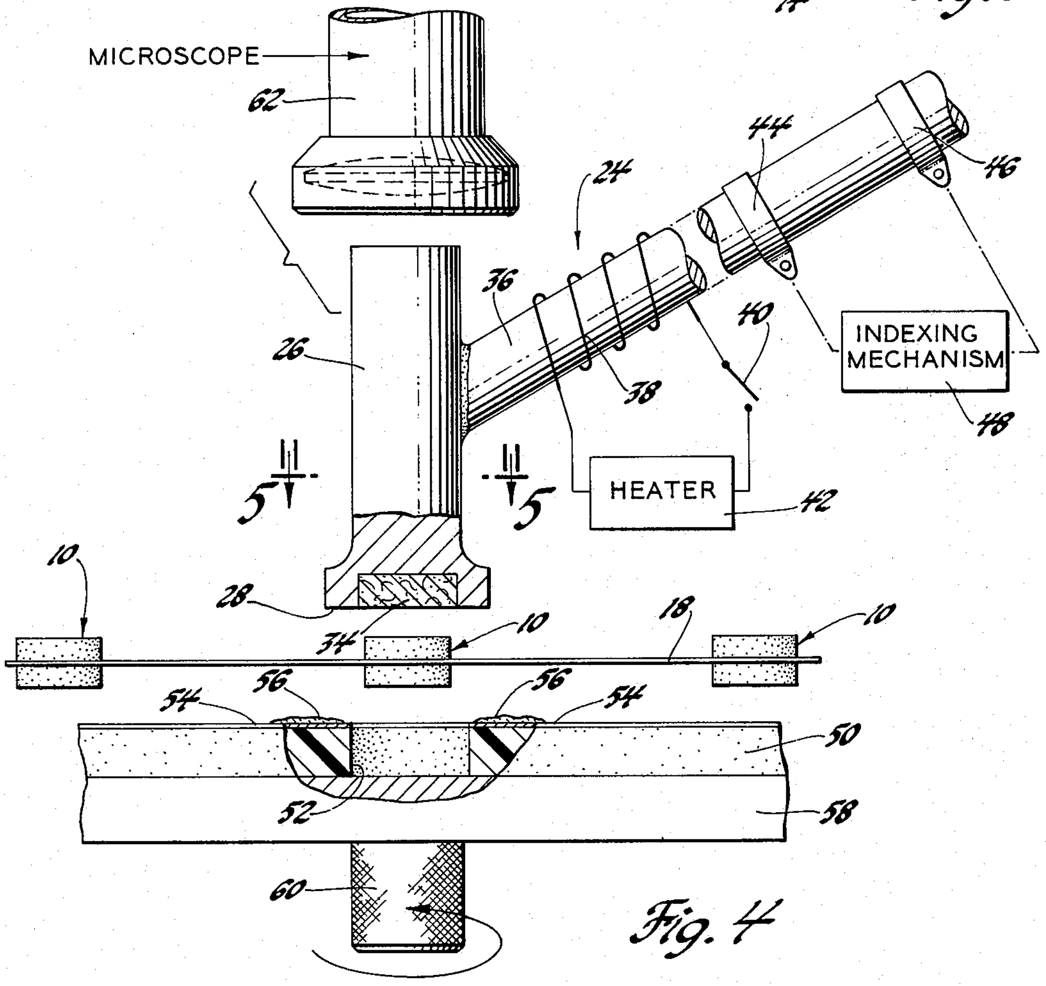
FIG. 4 is an elevational view with parts broken away showing one embodiment of the transfer and bonding apparatus of this invention.

An arm 36 is connected, as by welding, to the upper portion of tool 26 as can be seen most clearly in FIG. 4. Arm 36 is a solid rod of stainless steel which is about 1/2 inch in diameter. The arm 36 extends away from tool 26 at an angle of about 45° measured from the horizontal, in this example. However, the shape and angle of connection between tool 26 and arm 36 may be varied as desired. A heating coil 38 surrounds the lower portion of arm 36 nearest tool 26. Heating coil 38 is series connected with a switch 40 and a current source 42 which has been labeled "Heater" for purposes of illustration. Two clamps 44 and 46 surrounding the arm 36 connect the device 24 to a supporting indexing mechanism 48. The indexing mechanism 48 provides means, through tool extension arm 36, for applying a downward force of approximately 20 psi to tool 26. It similarly provides means for lifting tool 26.

A printed circuit board 50 has an opening 52 extending therethrough. By a printed circuit board we mean an insulative substrate having a plurality of electrically conductive paths or conductors thereon providing electrical connection between various component locations on the substrate. The substrate, for example, can be of ceramic or of a phenolic resin impregnated cloth or paper laminate. Opening 52 is circular with a diamter of about 0.16 – 0.18 inch. It should be noted that the diameter of tool surface 28 should be at least 0.01 inch larger than that of opening 52. A plurality of printed conductors 54 are located on the top surface of circuit board 50. Conductors 54 have inner end portions that converge to opening 52 in the circuit board 50 in a pattern corresponding to pill leads 16. The inner portions of conductors 54 adjacent opening 52 have a thin layer of solder 56 thereon. For convenience in illustrating this invention, solder layer 56 is not shown in FIGS. 5 through 7. Circuit board 50 is disposed on a supporting alignment table 58. For further ease of illustration, alignment table 58 is shown merely as a plate with a knob 60 attached to it. However, it should be understood that other well known means for vertical, horizontal and rotational alignment of circuit board 50 can be used. A microscope 62 is shown schematically in FIGS. 4 and 6. The microscope 62 is positioned coaxially above tool 26 in mutual registration with the tool 26, pill 10 and opening 52 in circuit board 50. It should be understood that other visual enlargement means can also be used as a substitute for microscope 62.

According to the method of our invention, chip 12 is first bonded to lead frame 18. Each of the contact bumps 14 is soldered to their respective inner free end portion of leads 16. At this stage of the operation, leads 16 are still an integral part of lead frame 18. The contact bumps 14 are soldered to leads 16, for example, by hot gas bonding. This alignment and bonding can be that as described and claimed in U.S. Ser.-No.414,274, "Magnetic Alignment for Semiconductor Device Bonding," Hartleroad et al, filed Nov. 9, 1973, and which is assigned to the same assignee as the present invention. It should also be noted that chip 12 can be bonded to lead frame 18 by other known bonding techniques, such as ultrasonic bonding.

Figure 2:
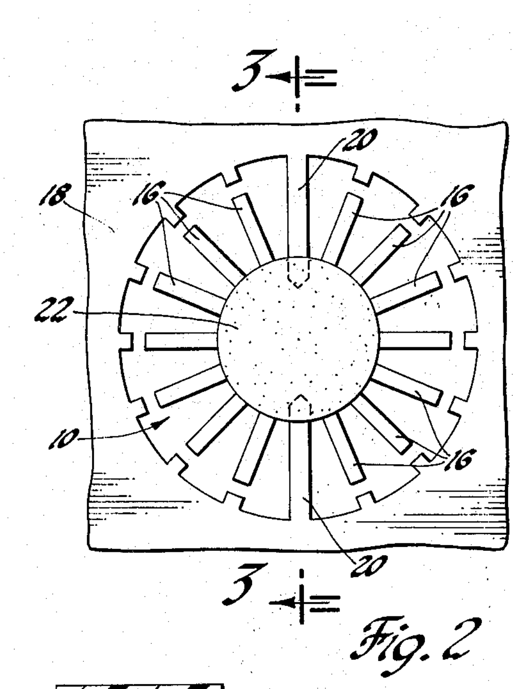
FIG. 2 is an enlarged fragmentary plan view of one of the semiconductor pill components shown in FIG. 1.
Figure 3:
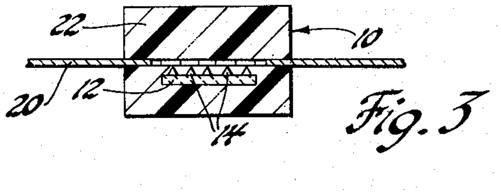
FIG. 3 is a sectional view along the lines 3—3 of FIG. 2.

The plastic encapsulation serving as body 22 is then molded around the chip 10, inner portions of leads 16, and the inner portions of holding tabs 20. It should be emphasized that the holding tabs 20 are not bonded to the chip 12 as are leads 16. Preferably, the plastic encapsulation is formed by known injection molding processes. The individual leads 16 are severed from the lead frame 18 as can be seen in FIGS. 1 and 2. Thus, individual, spaced electrical connectors are provided for the chip 12. This miniature plastic encapsulated integrated circuit package is referred to as a pill because of its generally disc-shaped or tablet-like body 22. The holding tabs 20 remain embedded in the body 10 and provide temporary support or attachment between it and the lead frame. After the leads 16 have been severed, each pill 10 may be tested with suitable electronic testing equipment.

The peripheral portions of lead frame 18 are then clamped together by a frame member 64 or other suitable structure to provide a somewhat rigid support for the lead frame 18. Lead frame 18 is then positioned parallel to the circuit board 50 as can be seen most clearly in FIG. 4. The lead frame 18 is spaced about 0.125 inch from the top surface of circuit board 50. This distance can be varied somewhat. However, in this embodiment, it should be no greater than 0.25 inch.

Tool 26 is then positioned over one of the pills 10 as shown in FIG. 4. Microscope 62 is then brought into mutual registration with tool 26 and pill 10. The microscope is focused so that an operator looking through the microscope 62 can look down and around tool 26 to visualize the other portions of pill leads 16 as shown in FIG. 5. Circuit board 50 is then brought into position by the alignment table 58. The circuit board is moved horizontally so that the opening 52 is concentric with pill body 22. The circuit board is rotated via knob 60 until the circuit board conductors 54 are radially aligned with their corresponding pill leads 16 as also can be seen in FIG. 5. It should also be noted that in such manner, holding tabs 20 are also aligned with slots 30 and 32 in tool 26.

After alignment, the indexing mechanism 48 is actuated to provide a downward force to tool 26. The following transfer and bonding operation occurs in one continuous downward movement of tool 26 and is completed in a relatively short time, thus facilitating high productivity in production. However, its operation will be explained chronologically as a step by step procedure. The tool 26 can be continually heated by closing switch 40 thereby activating heater coil 38. In such manner, the peripheral portions of tool end surface 28 are heated above the melting point of solder 56. The downward movement of tool 26 causes insert 34 in end surface 28 to abut the top of pill body 22. Further downward motion forces the pill body 22 into the opening 52 in circuit board 50 as can be seen in FIGS. 6 through 8. Accordingly, the metal peripheral portions of tool end surface 28 press all of leads 16 against their respective circuit board conductors 54. Since the peripheral portions of tool 28 are heated, the solder 56 melts to simultaneously bond all the individual pill leads 16 to their corresponding circuit board conductors 54 as seen most clearly in FIG. 8. It is a feature of this invention that insert 34 protects the plastic pill body 22 from the heat of the foregoing soldering operation. In such manner, pill body 22 is not deformed, nor are the electrical characteristics of chip 12 adversely affected due to the heat. Turning especially to FIG. 7, it is another feature of this invention that holding tabs 20 are automatically pulled from pill body 22. However, holding tabs 20 do not disengage pill body 22 until just before tool end surface 28 presses pill leads 16 against their respective circuit board conductors 54. In such manner, pill lead-circuit board conductor alignment is not disturbed. This is accomplished by the coaction of holding tabs 20 with slots 30 and 32 in tool 26. If it were not for the slots 30 and 32, the holding tabs 20 would pull out of the pill body 22 too soon, allowing the pill 10 to drop freely which may consequently disturb the alignment. The spacing between the lead frame and circuit board of course is also a factor as to when the holding tabs will be torn from the pill body. We have found that a 0.025 inch indentation in slots 30 and 32 for a lead frame-circuit board spacing of less than 0.25 inch provides satisfactory results.

The indexing mechanism 48 raises tool 26 to leave the finished product as shown in FIG. 8. This process can be easily and rapidly repeated to bond other pills to other corresponding circuit board conductors. For example, a new pill can be positioned under tool 26 and a new circuit board 50 brought underneath it. Frame member 64 for the lead frame 18 can be attached to suitable indexing mechanisms (not shown) similar to that of indexing mechanism 48. The two indexing mechanisms can be programmed so that a new pill is automatically positioned over a new circuit board once bonding tool 26 has been raised after prior bonding of a pill. Alignment of the pill leads and circuit board conductors is then accomplished as hereinbefore described. The indexing mechanism 48 is then actuated to transfer and bond the new pill to its respective circuit board conductor.

It should now be evident that we have invented an efficient, production oriented method of bonding extremely small semiconductor pill components to a circuit board. By providing a method and apparatus for directly transferring a pill from the same lead frame structure in which the semiconductor chip was attached, handling problems of these miniature components are substantially reduced. Hence, the method and apparatus of this invention allows the high volume manufacturer to bond a semiconductor chip to a lead frame structure, encapsulate it, test it, and then transfer and bond it directly to a circuit board for use in a wide variety of applications. More importantly, however, our invention eliminates the necessity of packaging the pill in another larger package so that it, in turn, can be bonded to the circuit board. The larger package, such as the common dual-in-line (DIP) package was heretofore needed because prior art apparatus and methods could not efficiently and accurately bond the miniature pill component directly to the circuit board. Hence, our invention eliminates the costly need for packaging these pill components within another larger package in order to bond it to corresponding circuit board conductors.

What we claim as new and desire to secure by Letters Patent of the United States is:

1. A method of simultaneously transferring miniature semiconductor pill-type components from a lead frame temporary carrier and soldering said components directly to a printed circuit board, said method comprising:

supporting a lead frame having a plurality of individual semiconductor miniature pill-type components temporarily attached thereto, said components having a plastic body encapsulating a semiconductor device chip and a plurality of discrete leads for said chip extending radially from said body in a generally common plane, said components being temporarily attached to said lead frame by at least two holding tabs extending from said lead frame into said plastic body;

holding said lead frame parallel with and within about 0.25 inch above a printed circuit board, said circuit board having an opening therein adapted for receiving said component body and a plurality of solder-coated conductors corresponding to said component leads converging on said opening in the circuit board;

aligning one of said components in said lead frame with a rod-like portion of a combination transfer and soldering device, said portion having an end adjacent said component with a periphery corresponding to and slightly smaller than the periphery of said component leads whereby said leads can be seen when viewing along the length of said rod from the opposite end, said end having slots therein corresponding to said component holding tabs in said lead frame;

registering said component leads with said corresponding conductors converging on said circuit board opening while viewing said leads and conductors from said opposite end of said combination transfer and soldering device;

moving said combination transfer and soldering device toward said circuit board to sequentially engage said end with said component body, press said body into said circuit board opening, pull said body away from said lead frame holding tabs after maintenance of component lead-conductor registration is assured, and finally clamp said leads against said circuit board conductors; and heating at least said end of said combination transfer and soldering device to a temperature greater than the melting point of said solder on said circuit board conductors while concurrently isolating said component body from deleterious heat to solder all of said component leads simultaneously to said circuit board conductors without adverse effects on said semiconductor device chip in said body.

2. A method of simultaneously transferring miniature semiconductor pill-type components from a lead frame temporary carrier and soldering said components directly to a printed circuit board, said method comprising:

supporting a lead frame having a plurality of individual semiconductor pill-type components temporarily attached thereto, said components having a disc-shaped plastic body with a semiconductor device chip therein and a plurality of discrete leads for said chip extending radially from said body in a generally common plane, said components being temporarily attached to said lead frame by two diametrically opposite holding tabs extending from said lead frame into said plastic body;

holding said lead frame parallel with and about 0.125 inch above a printed circuit board, said circuit board having a circular opening therein adapted for receiving said component body and a plurality of solder-coated conductors corresponding to said component leads converging on said opening in the circuit board;

aligning one of said components in said lead frame with a solid, rod-like portion of a combination transfer and soldering device, said portion having an enlarged end adjacent said component with a circular periphery having a diameter slightly smaller than the diameter defined by said component leads whereby said leads can be seen when viewing along the length of said rod from its opposite end, said enlarged end having slots therein corresponding to component holding tabs in said lead frame;

registering said component leads with said corresponding conductors converging on said circuit board opening while viewing said leads and conductors from said opposite end of said combination transfer and soldering device;

moving said combination transfer and soldering device toward said circuit board to sequentially engage said enlarged end with said component body, press said body into said circuit board opening, pull said body away from said lead frame holding tabs after maintenance of component lead-conductor registration is assured, and finally clamp said leads against their corresponding circuit board conductors; and heating at least said enlarged end of said combination transfer and soldering device to a temperature greater than the melting point of said solder on said circuit board conductors while concurrently isolating said component body from deleterious heat thereby soldering all of said component leads simultaneously to said circuit board conductors without adverse effects on said semiconductor device chip in said body.

3. Apparatus for simultaneously transferrring miniature semiconductor pill-type components from a lead frame temporary carrier and soldering said components directly to a printed circuit board, said apparatus comprising:

means for supporting a lead frame having a plurality of semiconductor pill-type components temporarily attached thereto, said components having a plastic body encapsulating a semiconductor device chip with a plurality of leads for said chip radially extending from said body in a generally common plane, said component being temporarily attached to said lead frame by at least two holding tabs extending from said lead frame into said component body;

means for supporting a printed circuit board having an opening therein for receiving said component body, a plurality of solder-coated conductors on said circuit board corresponding with said component leads and converging on said opening in the circuit board;

means for holding said lead frame parallel with and within said 0.25 inch above said circuit board;

a solid, rod-like combination transfer and soldering tool for transferring one of said components from said lead frame and for directly soldering it to said circuit board;

a metallic end surface on said tool, said tool end surface being larger than said circuit board opening yet smaller than the surface defined by outer portions of said component leads whereby said outer portions of said leads can be seen when viewing along the length of said rod from its opposite end;

slots in peripheral portions of said tool end surface, said slots corresponding to said holding tabs in said lead frame and being adapted to receive said holding tabs upon movement of said tool end surface against one of said components;

a heat insulative insert in inner portions of said tool end surface, said heat insulative insert corresponding with said component body and providing protection of said semiconductor device chip within said body from deleterious heat effects during soldering;

means for aligning said tool with one of said components so that said tool end surface is adjacent said component body;

visual enlargement means positioned adjacent the opposite end of said combination transfer and soldering tool wherein said lead outer portions and inner portions of said conductors may be seen when viewing along the length of said rod;

means for registering said component leads with said circuit board conductors while viewing said lead outer portions and inner portions of said conductors;

means for moving said combination transfer and soldering tool toward said circuit board wherein said tool end surface abuts said component body to urge it into said circuit board opening, further movement of said tool causing said holding tabs to coact with said slots to automatically remove said holding tabs from said component body while retaining said component lead-conductor registration, and wherein even further movement of said tool causes peripheral portions of said tool end surface to press said component leads against their corresponding conductors; and means for heating at least said tool end surface to a temperature above the melting point of the solder on said conductors thereby soldering all of said component leads simultaneously to their corresponding conductors while said heat insulative insert protects said semiconductor device within said component body from deleterious effects of said heat.

4. Apparatus for simultaneously transferring miniature semiconductor pill-type components from a lead frame temporary carrier and bonding said components directly to a printed circuit board, said apparatus comprising:

means for supporting a lead frame having a plurality of semiconductor pill-type components temporarily attached thereto, said components having a plastic disc-shaped body encapsulating a semiconductor device chip with a diameter of $D_b$ and a plurality of leads for said chip radially extending from said body in a generally common plane whose periphery defines a circle with a diameter of $D_1$, said component being temporarily attached to said lead frame by two diametrically opposite holding tabs extending from said lead frame into said component body;

means for supporting a printed circuit board having a circular opening therein with a diameter greater than $D_b$ yet less than $D_1$, a plurality of solder-coated conductors on said circuit board corresponding with said component leads and converging on said opening in the circuit board;

means for holding said lead frame parallel with and within about 0.25 inch above said circuit board;

a solid, metallic rod-like combination transfer and soldering tool for transferring one of said components from said lead frame and for directly soldering it to said circuit board;

a circular, flat end surface on said tool, said tool end surface having a diameter greater than the diameter of said circuit board opening yet less than $D_1$ whereby outer portions of said leads can be seen when viewing along the length of said rod from its opposite end;

two diametrically opposite slots in peripheral portions of said tool end surface, said slots corresponding to said holding tabs in said lead frame and being adapted to receive said holding tabs upon movement of said tool end surface against one of said components;

an asbestos insert in inner portions of said tool end surface, said asbestos insert having a face coplanar with said tool end surface and being circular with a diameter of about $D_b$ thereby providing protection of said semiconductor device chip within said body from deleterious heat effects during soldering;

means for aligning said tool with one of said components so that said tool end surface is above said component body;

visual enlargement means positioned above said combination transfer and soldering tool wherein said lead outer portions and inner portions of said conductors may be seen when viewing along the length of said rod;

means for registering said component leads with said circuit board conductors while viewing said lead outer portions and inner portions of said conductors;

means connected to said tool for providing a downward movement to said tool wherein said tool end surface abuts said component body to urge it into said circuit board opening, further downward movement of said tool causing said holding tabs to coact with slots to automatically remove said holding tabs from said component body while retaining said component lead-conductor registration, and wherein even further downward movement of said tool causes peripheral portions of said tool end surface to press said component leads against their corresponding conductors; and means for continually heating at least said tool end surface to a temperature above the melting point of the solder on said conductors thereby soldering all of said component leads simultaneously to their corresponding conductors while said asbestos insert protects said semiconductor device within said component body from deleterious effects of said heat.

* * * * *

UNITED STATES PATENT AND TRADEMARK OFFICE
CERTIFICATE OF CORRECTION

PATENT NO. : 3,911,569

DATED : October 14, 1975

INVENTOR(S) : Ronald J. Hartleroad and James P. Grabowski

It is certified that error appears in the above-identified patent and that said Letters Patent are hereby corrected as shown below:

Column 4, line 2, "A hat insulative" should read -- A heat insulative --.

Column 4, line 3, "asbestos of Vespar" should read -- asbestos or Vespar --.

Column 9, line 8, "within said 0.25 inch" should read -- within about 0.25 inch --.

Column 10, line 61, "coact with slots" should read -- coact with said slots --.

Signed and Sealed this

*tenth* Day of *February 1976*

[SEAL]

*Attest:*

RUTH C. MASON
*Attesting Officer*

C. MARSHALL DANN
*Commissioner of Patents and Trademarks*